United States Patent

Debroux

[11] Patent Number: 5,506,525
[45] Date of Patent: Apr. 9, 1996

[54] SAMPLING CIRCUIT FOR ANALOG SIGNALS

[75] Inventor: Jean-françois Debroux, St. Etienne de St. Geoins, France

[73] Assignee: Thomson Composants Militaires Et Spatiaux, Courbevoie, France

[21] Appl. No.: 916,123

[22] PCT Filed: Jan. 25, 1991

[86] PCT No.: PCT/FR91/00043

§ 371 Date: Jul. 29, 1992

§ 102(e) Date: Jul. 29, 1992

[87] PCT Pub. No.: WO91/11812

PCT Pub. Date: Aug. 8, 1992

[30] Foreign Application Priority Data

Jan. 30, 1990 [FR] France ................... 90 01069

[51] Int. Cl.⁶ .................. G11C 27/02; G06G 7/12
[52] U.S. Cl. ................... 327/91; 327/73; 327/94; 327/362; 327/563
[58] Field of Search .................. 307/352, 353, 307/358, 359, 491, 494; 328/127, 150, 151

[56] References Cited

U.S. PATENT DOCUMENTS

| | | |
|---|---|---|
| 3,706,986 | 12/1972 | Petit et al. . |
| 4,352,070 | 9/1982 | Beauducel et al. .............. 307/353 |
| 4,404,479 | 9/1983 | Toyomaki .................. 307/353 |
| 4,698,523 | 10/1987 | Gershon et al. ................ 307/353 |
| 4,724,395 | 2/1988 | Freeman ................... 307/353 |
| 4,804,863 | 2/1989 | Welland et al. ............. 307/352 |
| 4,962,325 | 10/1990 | Miller et al. ............... 328/151 |
| 5,034,701 | 7/1991 | Debroux . |
| 5,061,865 | 10/1991 | Durst ................... 328/151 |

FOREIGN PATENT DOCUMENTS

| | | |
|---|---|---|
| 0279993 | 8/1988 | European Pat. Off. . |
| 0313031 | 4/1989 | European Pat. Off. . |
| 2134159 | 12/1972 | France . |
| 0033799 | 2/1989 | Japan ................. 307/353 |

Primary Examiner—Timothy P. Callahan
Assistant Examiner—Trong Phan
Attorney, Agent, or Firm—Oblon, Spivak, McClelland, Maier & Neustadt

[57] ABSTRACT

A sampling circuit which obtains a level of sampled-and-held signal which is determined with respect to a well-determined reference level V0, even though the input signal is a useful signal referenced with respect to a low-stability reference level. This is the case in particular for sampling of signals derived from charge-transfer photosensitive devices for which the dark level can vary. The circuit includes a sample-and-hold device (EB1) and an input via a capacitor (C1), with a reset circuit which periodically charges the capacitor (C1) to a value which is roughly the difference between the (variable) input reference level and the (fixed) output reference level. According to the invention, it is provided that the reset circuit comprises a looped amplifier (AD1) in which the loop (B1, EB2, B2) is designed to introduce a voltage level shift equal to the shift introduced intrinsically by the sample-and-hold device (B1, EB1, B2).

24 Claims, 2 Drawing Sheets

SAMPLING CIRCUIT FOR ANALOG SIGNALS

BACKGROUND OF THE INVENTION

1. Field of the Invention

The invention relates to sample-and-hold circuit for analog electrical signals.

One example of an application for which the present invention is particularly suited is the processing of analog electrical signals derived from photosensitive sensors of the charge-transfer type, or other charge-transfer devices.

2. Discussion of the Background

Although the invention applies in other cases, the example of signals derived from charge-transfer photosensitive sensors will be given.

The constraints in processing these signals are speed and precision of measurement of the signals from these sensors.

The signals are presented in the form of successive voltage square waves separated by a plateaus at a reference voltage level. This corresponds, in fact, to the fact that the signals result from the conversion of packets of photosensitive charges transported by shift registers. The voltage level of one square wave corresponds to a quantity of charges which represents the illumination of a point. The voltage level of a following square wave represents the illumination of the following point. The voltage level of the plateau which separates them corresponds to a black level.

A black level may vary slowly in the course of an analysis of an image, but it is always necessary for the useful signal level of the square waves to be referenced with respect to this black level.

In order to be able to effect processing of the received image point by point, it proves to be necessary to sample and hold the signal level of each square wave for as long a time as possible. That is to say, in practice, during the whole period separating one square wave from the next one. In fact, in order to rapidly process numerous points, it is necessary for them to succeed each other at a high rate, and thus a very short time is available for processing each signal. The processing is, for example, analog-digital conversion.

Hence the signal processing constraints are, on the one hand, the sampling and the holding of the signal over one complete period, and, on the other hand, the establishing of a fixed reference voltage level of the sampled-and-held output signal, knowing that the reference level of the input signal can vary. The other constraints are speed of processing and precision.

FIG. 1 represents, by way of example, the input signal S1 in the form of square waves with the reference plateaus (level Vr1 susceptible to drifting in the course of time) and the useful signal square waves V1, the useful signal value being the difference V1-Vr1 between the level of the square wave and the level of the plateau just before or just after. FIG. 1 also represents the desired output signal S2, namely a signal which is sampled and held during a time interval equal to that which separates two successive square waves of the input signal. The signal S2 is a succession of staircase steps of variable levels V2 which are referenced with respect to a fixed reference voltage V0. Each step level V2 taken with respect to this reference level represents the useful signal level V1 taken with respect to the plateau Vr1. It is assumed, for simplicity's sake, that the sampler which establishes S2 has unity gain.

The conventional solutions used to produce this sampling are the following: the signal input can be applied to one input of a differential amplifier, and applied also to another input of the amplifier, but with a delay corresponding to one input signal half-period (delay produced by a delay line). In this way, one of the inputs receives a useful signal level V1 while the other receives the immediately preceding or following plateau level Vr1. The output of the amplifier is applied to a sample-and-hold device whose reference is the voltage V0. The sample-and-hold device maintains a level V2-V0 which is equal to V1-Vr1 from one sampling instant up to the following sampling.

This circuit operates only on condition that the square waves have very good frequency constancy, so that the delay introduced by the delay line corresponds well to one half-period of the input square waves. If the frequency is changed, it is necessary to change delay lines. Moreover, the differential amplifier is relatively tricky to produce as it has to possess very good common-mode rejection at the frequency of the signal. Otherwise the drift in the reference plateaux of the input signal is not eliminated. A good common-mode rejection is difficult to obtain if it is necessary to work at high frequency.

Another solution uses two sample-and-hold devices receiving the input signal in parallel, one of them sampled during the reference plateaus and the other during the square waves corresponding to the useful signal. A differential amplifier forms the difference between the two sampled-and-held levels and references this difference with respect to a reference level V0. Here again, the amplifier has to possess good common-mode rejection. Moreover the circuit necessitates two sample-and-hold devices, which is more expensive.

A solution using a single sample-and-hold device has been envisaged. It comprises, on the one hand, a sample-and-hold device and, on the other hand, a reference level periodic locking loop at the input of the sample-and-hold device.

The circuit is represented in FIG. 2. The input of the circuit is applied through a capacitor C1 to the input of a basic sample-and-hold device EB1. The output of the sample-and-hold device EB1 constitutes the output S2 of the circuit. At the input and at the output of the sample-and-hold device EB1 are represented buffer amplifiers B1 and B2 respectively, which have a function only of impedance matching in order to avoid charging the capacitors of the circuit by over-heavy currents. However, the sample-and-hold device proper is constituted diagrammatically by a switch followed by a capacitor. The switch permits, when it is closed during a sampling instant, charging the capacitor to the voltage level applied at the input of the sampler. Sampling takes place during the useful signal square waves.

A reference plateau level locking loop is provided. It is represented symbolically in FIG. 2. It comprises a differential amplifier AD1 one input of which is linked to a reference voltage V0; another input is linked to the output of the amplifier; this output is linked, by means of a switch K1, to the input of the sample-and-hold device EB1 (either before or after B1). The switch is closed periodically by a locking signal Sv (which is sent out during the reference plateaus of the input signal and not during the useful square waves).

The circuit operates in the following manner: the locking signal establishes, by looping of the amplifier AD1, the reference voltage level V0 on the input of the sampler. As the locking signal Sv is applied when the input signal is at its plateau Vr1, the capacitor C1 charges to the voltage V0-Vr1.

At the end of the locking signal, the capacitor C1 keeps this charge, the locking loop being disconnected (opening of K1) from the input of the sample-and-hold device. The input signal applied next to the sample-and-hold device is then the useful signal V1 to which it is necessary to add the voltage due to the charge of the capacitor. The signal applied to the sample-and-hold device is therefore V1–Vr1+V0. This is a signal representing the useful level of the square wave with respect to the plateau, but referenced with respect to V0.

It is this level which is sampled in the capacitor C2 of the sample-and-hold device EB1 and which is next kept in memory until the following sampling. The capacitor C2 has one reference end connected, for example, to a zero-potential earth. The following sampling will be preceded by a new locking step of the input plateau with respect to the reference voltage V0.

In other words, if the useful signal is equal to the reference plateau, whatever the level of the reference plateau since the latter can vary, the sampled signal will be equal to V0. If the useful signal is different from the reference level, the difference will be added to V0 in the sampled signal.

The advantage is that it is not necessary to produce a differential amplifier with enhanced characteristics. In fact, there is no common-mode-rejection problem since this amplifier receives only one error signal.

Another advantage is that the output signal can be referenced with respect to a non-nil voltage V0 (that is to say not equal to the voltage with respect to which the capacitor C2 of the sample-and-hold device is charged). In this case, for example, the reference level V0 can be chosen as a function of the zero of the analog-digital converter which will often be found downstream from the sampling circuit.

One difficulty in a practical embodiment of the diagram of FIG. 2 results from the fact that the sample-and-hold device EB1 itself risks introducing a voltage shift, due especially to the junctions of the transistors of which it is comprised (for example in the case of embodiments in bipolar technology). In order to avoid this, it would be possible to provide for the looped-back output of the differential amplifier (and the corresponding input) to be linked to the output of the sample-and-hold device EB1 and not to its input. During the locking signal, the input capacitor C1 then charges to a value such that the output is actually V0 during the plateau. However, this requires supplementary sampling to be provided during the input reference plateau, in order to be able to effect the level locking during this plateau. On the contrary, in fact, it is desirable for the useful signal to be held for as long as possible, that is to say for it to occupy, if possible, the whole duration available between two useful signal square waves.

SUMMARY OF THE INVENTION

The invention proposes a novel sample-and-hold circuit making it possible to obtain as satisfactory a compromise as possible with respect to the set of constraints weighing on this type of circuit and especially the constraints which have been set out in detail above.

According to the invention, it is proposed, in a sampling circuit comprising a basic sample-and-hold device and a reference level locking loop, to compensate for the voltage shifts introduced between the input signal and the output signal (especially by the sample-and-hold device), with the aid of circuit elements placed in the level locking loop, these elements introducing a voltage shift identical to the shifts for which it is desired to compensate.

The locking circuit comprises, for example, a looped differential amplifier having a first input linked to a reference voltage, an output linked to the input of the sample-and-hold device, a switch for periodically opening and closing a link between the differential amplifier and the input of the sample-and-hold device, and a feedback loop linking the output of the differential amplifier to a second input of the latter; the sample-and-hold device introducing a voltage level shift between its input and the output of the sampling circuit; the feedback loop comprising circuit elements introducing the same voltage shift as the shift present between the input of the sample-and-hold device and the output of the sampling circuit.

In principle, the input signal of the circuit according to the invention is applied to the sample-and-hold device through a capacitor. It is this capacitor which will keep in memory a voltage which is the difference between the reference voltage of the amplifier and the reference plateau of the input signal, augmented by the voltage shift introduced by the circuit elements of the feedback loop.

In a practical embodiment, the basic sample-and-hold device comprises an input signal linked to the base of a first transistor mounted as a voltage follower, an output linked to the emitter of this first transistor, a capacitor linked to this output for memorizing an output voltage between two sampling instants, and a sampling control input for blocking or allowing conduction by the follower transistor; the circuit elements introducing a voltage shift comprise a second transistor mounted and supplied like the first, the base-emitter junction of this second transistor being in series in the feedback loop.

Preferably also, the sample-and-hold device comprises a third transistor in series between the emitter of the first and a source of emitter supply current, the sampling command being linked especially to the base of this third transistor, characterised in that the circuit elements introducing a voltage shift comprise a fourth transistor in series between the emitter of the second and a source of emitter supply current source identical to the first, the base of this transistor being controlled in such a way that the currents in the second and fourth transistors are identical, so that the base-emitter voltages of the first and second transistors are also identical.

Other characteristics and advantages of the invention will appear on reading the description which follows and which is given by reference to the attached drawings in which:

DESCRIPTION OF THE PREFERRED EMBODIMENTS

Figure 3:
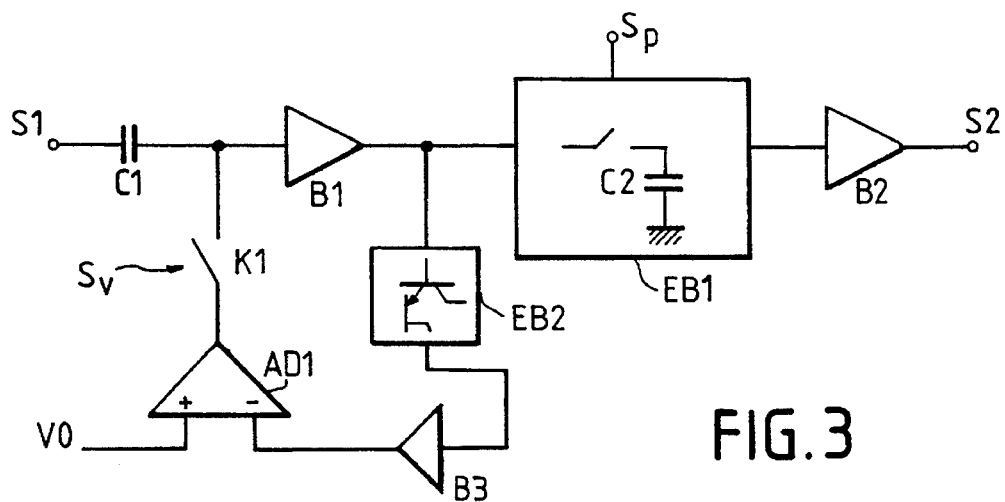
FIG. 3 represents a block diagram of the invention.

The block diagram of FIG. 3 comprises a signal input S1 linked to a terminal of a capacitor C1 whose other terminal is linked to the input of a sample-and-hold device EB1. The sample-and-hold device comprises, if necessary, (or is preceded and followed by) buffer amplifiers B1 and B2 making it possible to establish high input impedances preventing the discharge of the capacitors which have to maintain defined voltages at their terminals.

The sample-and-hold device proper diagrammatically comprises a switch which is closed during a sampling instant and open during the hold time which follows the sampling instant, until the following sampling instant. This switch makes it possible to charge a capacitor C2 with the voltage present at the input of the sampler. On opening the switch, the capacitor C2 preserves its charge up to the following sampling instant, to the extent that the input impedance of B2 is sufficiently high. The capacitor C2 has a reference terminal connected, for example, to an electrical earth with respect to which all the voltage values are measured.

The diagram comprises a reference voltage level locking circuit. This circuit comprises a looped differential amplifier and has the role of establishing, during level reset instants, a voltage at the terminals of the capacitor C1, as a function of the reference voltage level V0 of the circuit and as a function of a reference level Vr1 which is characteristic of the input signal S1. Between two successive reset instants, the capacitor C1 preserves this level reset voltage at its terminals.

The reset instants, defined by a locking signal Sv, are chosen while a voltage level corresponding to the reference voltage level of the input signal is applied to the signal input S1. In the example described with regard to FIG. 1, in which the useful signal is constituted by square waves separated by plateaus corresponding to the reference level (possibly slowly variable), a level locking signal is established during the plateaus separating the useful square waves.

The locking signal controls a switch K1 serving to link the output of a differential amplifier AD1 to the input of the sample-and-hold device. In practice, it will be seen that the switch is not necessarily situated between an output of the amplifier and the input of the sampler. In the bipolar technology of fabrication of integrated circuits, it will in fact be seen that it is easier, for example, to cut off and restore the supply to the amplifier. In any event, the locking signal has to act so as to connect a circuit making it possible to charge the capacitor to the desired voltage then to disconnect this circuit in order to isolate the capacitor so that it does not lose this charge.

The differential amplifier AD1 comprises two inputs; a non-inverting input (for example) is linked to a reference voltage source V0. An inverting input is linked, by means of a feedback loop, to the input of the sample-and-hold device EB1.

The feedback loop comprises circuit elements giving rise, between the output of the amplifier (connected to a terminal of the capacitor during reset) and the inverting input, to a voltage level shift which is exactly equal to the shift which is introduced by construction between the same terminal of the capacitor and the output S2 of the sample-and-hold circuit.

The output S2 of the sampling circuit is taken, for example, to the output of the buffer amplifier B2. In these conditions, voltage level shifts can be introduced by the buffer amplifier B1, then by the sampler EB1, then by the buffer amplifier B2.

The feedback loop then comprises, between the terminal of the capacitor C1 and the inverting input of the amplifier AD1, the following elements in succession: first of all the buffer amplifier B1 (this could be an amplifier identical to B1, but here it is as simple to take B1), then a circuit element EB2 giving rise to the same voltage shift as EB1, then a buffer amplifier B3 identical to B2 (or at least giving rise to the same voltage level shift). The element EB2 may be, as will be seen, a simple transistor switch analogous to the switch of the sampler EB1 but having no need of an actuating command.

Figure 1:
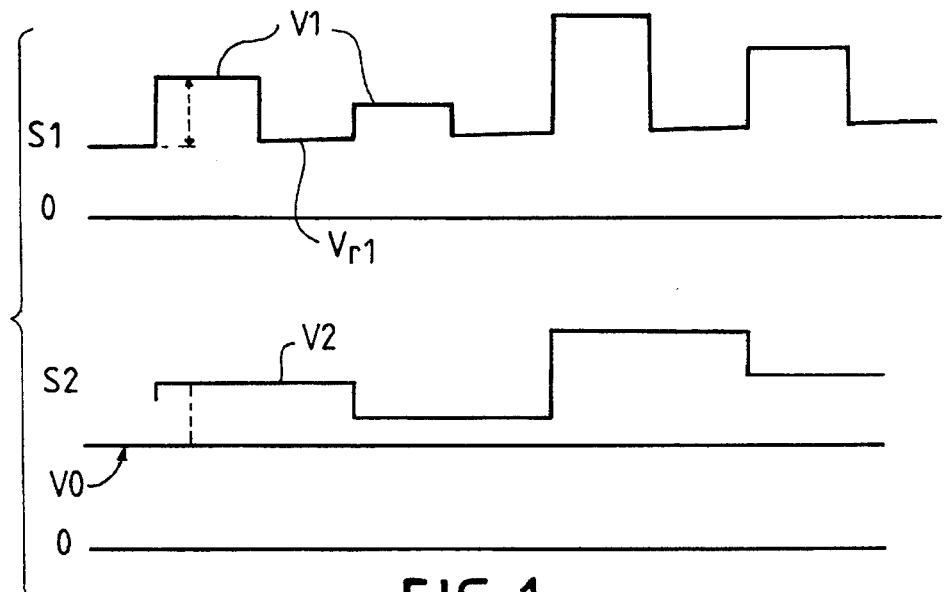
FIG. 1 represents input signals to be sampled and sampled output signals derived, for example, from a photosensitive sensor.
Figure 2:
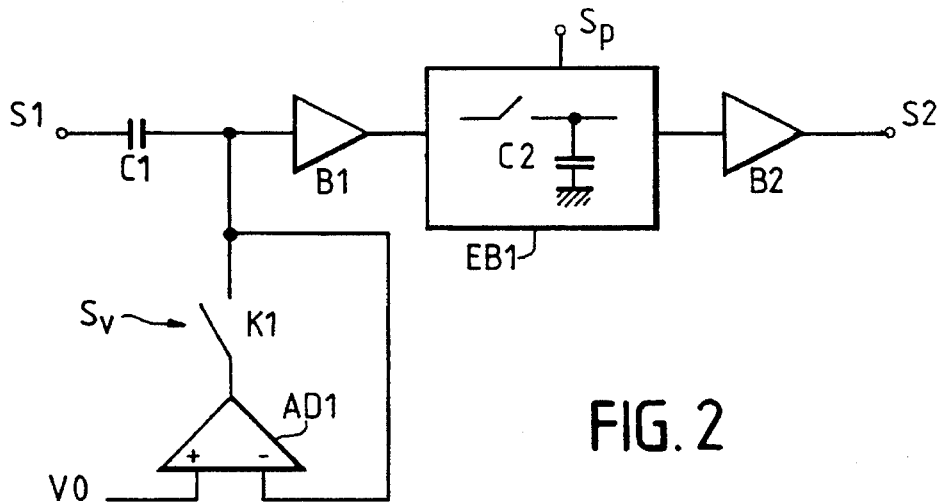
FIG. 2 represents a theoretical diagram of a sample-and-hold circuit using both a sample-and-hold device and an input reference level locking circuit.

With this diagram, the sample-and-hold circuit can function in the manner described below; the same voltage notations will be taken as those used with regard to FIGS. 1 to 3, designating, moreover, by dV the overall voltage level shift likely to be introduced by the succession of elements B1, EB1, and B2, or the identical shift introduced by the succession B1, EB2, B3.

During the reset instants defined by the signal Sv, the reference signal is at its variable plateau level Vr1 and is applied to one terminal of the capacitor C1. The looped amplifier transmits, via the switch K1, a voltage V0+dV to the other terminal of the capacitor C1, the offset voltage of the amplifier being assumed to be negligible. In fact, the looping of the amplifier necessarily brings the inverting input of the amplifier back to V0 in order to balance the voltage V0 present on the non-inverting input; and so that V0 should appear on the inverting input, having regard to the voltage shift dV introduced by the loop, it is necessary to have V0+dV on the second terminal of the capacitor C1.

Hence, the capacitor C1 charges to a voltage Vr1−V0−dV.

After the end of the signal Sv, the capacitor remains disconnected from the amplifier and cannot discharge.

During a sampling instant of the useful input signal, whose value is assumed to be V1, the voltage effectively transmitted on the second terminal of the capacitor is not V1 but V1−Vr1+V0+dV.

The buffer amplifier B1, the sample-and-hold device EB1, and the buffer amplifier B2 introduce a voltage shift dV such that the sampled and held voltage which is found at the output of the amplifier B2 and hence at the output of the circuit according to the invention is V1−Vr1+V0. Hence this is just the value desired, which is the difference between the useful input signal V1 and its characteristic reference level Vr1 which is possibly variable, this difference being keyed to the reference level V0.

The output reference level V0 can be chosen at will since it is the level which is applied to the input of a differential amplifier. In the case, for example, where the output signal of the sample-and-hold circuit of the invention is used as the input of an analog-digital converter, it is possible to take for V0 level a level corresponding to the digital zero value of the converter. Hence, in a converter working between −1 volt and +1 volt with an output digital value of zero for an analog input voltage of −1 volt, the choice will preferably be V0=−1 volt.

A detailed exemplary embodiment will now be given showing that if the sampler is produced in quite a simple fashion (in order to be rapid) it introduces a voltage shift which the invention compensates for perfectly.

Figure 4:
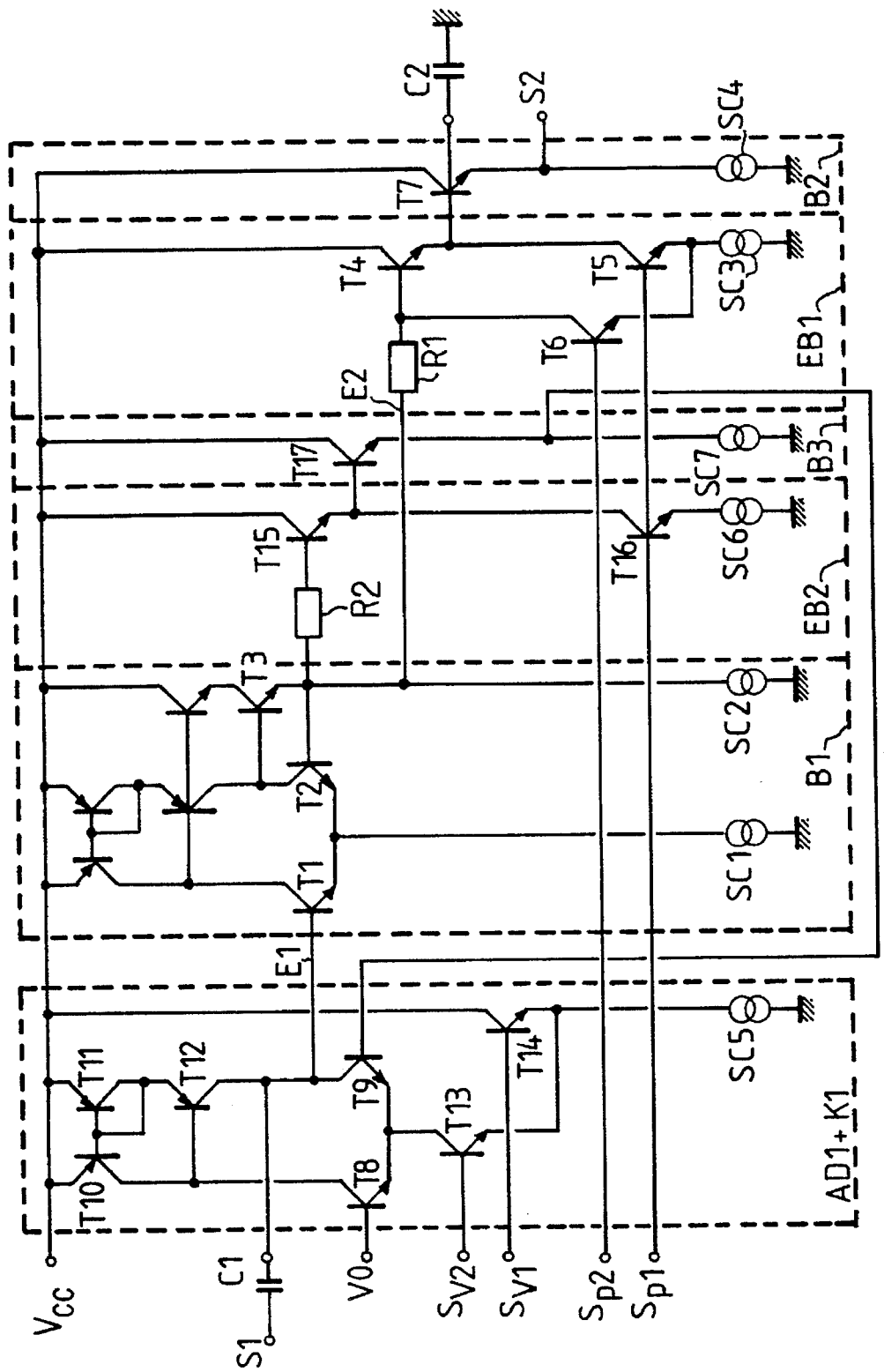
FIG. 4 represents a detailed diagram of an embodiment of the invention.

The example is represented in FIG. 4.

The blocks in dotted lines correspond to the general functions of FIG. 3 and are designated by the same references.

The signal input S1 is linked by a capacitor C1 to the input E1 of a follower amplifier B1 which is conventionally constituted on the basis of a differential pair of two transistors T1 and T2 and by a follower output stage which is a transistor T3 having its base connected to the collector of the transistor T2 and its emitter looped back onto the second input of the differential pair, that is to say onto the base of T2. The input E1 is the base of T1. The output of the stage B1 is taken on the emitter of T3. The differential pair T1, T2 is supplied by a current source SC1. The transistor T3 is supplied by a source SC2.

The output of the stage B1 is linked to the input E2 of the sample-and-hold device EB1. The latter is constituted by three transistors T4, T5, T6, a current source SC3, and a resistor R1. The input E2 is linked by the resistor R1 to the base of the transistor T4 which is a follower transistor having its collector linked to the general supply terminal Vcc of the circuit. The output of the sample-and-hold device EB1, is taken on the emitter of T4. This output is linked by a capacitor C2 to earth. The transistor T5 is interposed between the transistor T4 and the current source SC3. Its collector is linked to the emitter of T4, its emitter to the current source (linked moreover to earth). The base of T5 is controlled by a first conductor Sp1 of a sampling command which comprises two conductors Sp1 and Sp2. The second conductor Sp2 controls the base of the transistor T6, whose collector is linked to the base of T4 and whose emitter is linked, like the emitter of T5, to the current source SC3.

The sampling command is done by application of a differential signal between the conductors Sp1 and Sp2, in such a way as to turn off the transistor T6 rendering the transistor T5 conducting during the sampling instant. The transistor T4 is then conducting and the capacitor C2 can charge to the emitter voltage of T4. During the hold duration, between two sampling instants, the differential command Sp1, Sp2 renders the transistor T6 conducting and turns off the transistor T5, which turns off T4 (as its emitter current is nil, and its base voltage less than the emitter voltage). The capacitor C2 remains isolated due to T4 and T5 being turned off, and preserves the sampled charge.

The conductor Sp2 can be at a fixed voltage, the differential signal being constituted by a voltage variation of the conductor Sp1. It is important that the transistor T5 turns off before the transistor T6 becomes conducting in order to avoid any loss from the capacitor C2 at the start of the hold period following a sampling instant.

The buffer amplifier B2 is a follower transistor T7 supplied by a current source SC4; the output S2 of the sampling circuit is taken on the emitter of T7. Even if the load impedance on the output S2 is quite small, the presence of the buffer amplifier B2 prevents too-rapid discharge of the capacitor. The discharge of the capacitor takes place in fact through the base of T7 and not directly onto the impedance connected to the output S2.

This sample-and-hold device structure with three transistors and a current source is advantageous as it permits very rapid operation. The small number of transistors used and the fact that they can all be NPN transistors favors this rapidity in the case of monolithic embodiments.

However, it may be noted that, with respect to the voltage applied to the input E2 of the sample-and-hold device (voltage which it would actually be desired to sample and hold), the voltage actually obtained on the output S2 is shifted by reason of the voltage drops introduced by the base-emitter junction of T4 and by the base-emitter junction of T7. It will be noted that there is also a shift likely to be introduced between the input voltage of the circuit (at S1) and the input voltage of the sampler (at E2).

The reference voltage level locking loop makes it possible to compensate for this shift.

This loop comprises the differential amplifier AD1 and the changeover switch K1 which makes it possible to periodically connect the output of the amplifier AD1 to the capacitor C1 during a reset period then to disconnect it in order to preserve the charge of the capacitor up to the following reset instant.

The reset instants are defined by a locking signal which is a differential signal received between two conductors Sv1 and Sv2.

As has already been mentioned, it is not necessary for the switch K1 to be physically produced in the form of a switch connected between an output of the amplifier and a terminal of the capacitor C1. In the example represented, embodied in bipolar technology, it is simpler to provide for the switch to serve to interrupt the supply current of the differential amplifier as it is found that this interruption makes it possible to effectively isolate the capacitor C1 and to preserve the charge that it has acquired during the reset signal.

For this reason the differential amplifier comprises a conventional differential structure with two input transistors T8 and T9, charge transistors T10, T11, T12, and a current source SC5 for supplying the pair of differential branches.

A transistor T13 controlled by the conductor Sv2 makes it possible to link the differential pair to the current source SC5 (during the reset instants) or, on the other hand, to isolate it (between the reset instants). A transistor T14, controlled by the conductor Sv1, makes it possible to move the current from the source SC5 between the reset instants. It is conducting when T13 is turned off and vice-versa.

The non-inverting input of the amplifier is constituted by the base of the transistor T8; it is connected to a reference voltage source V0 which is the reference with respect to which it is desired to establish the output signal.

The inverting input is the base of the transistor T9. It is connected to the end of a feedback loop whose other end is constituted by the output of the differential amplifier. Here, this output is the collector of the transistor T9. This output is also connected to a terminal of the capacitor C1 (the one which is not linked to the signal input S1). It is consequently also connected to the input E1 of the buffer amplifier B1.

The feedback loop comprises, in series, starting from this input E1: first of all the buffer amplifier B1 itself. Then, linked to the output of the buffer amplifier B1 (emitter of the transistor T3), a stage EB2 intended simply to produce a voltage shift identical to that which is produced by the sample-and-hold device EB1, and finally a stage B3 intended to produce a shift identical to that of B2. In this example, the stage EB2 comprises a resistor R2 compensating for the resistor R1 and thus, preferably, identical to R1, a transistor T15 compensating for the effect of the transistor T4 and, preferably identical to T4 and mounted like it or mounted in such a way as to produce, between its base and its emitter, a voltage drop identical to the base-emitter voltage drop of T4; and a transistor T16 compensating for the transistor T5 and, preferably, identical to T5. It is not necessary to compensate for the transistor T6 which is conducting only during the hold instants and not during the sampling instants.

Hence, the simulation stage EB2 preferably comprises a transistor T15 whose base is linked to the output of the stage B1 by a resistor R2, and whose emitter is linked by means of a transistor T16 to a current source SC6 (preferably identical to SC3).

The output of the stage EB2 is taken on the emitter of T15 (just as the output of EB1 is the emitter of T4); it is linked to the input of a buffer amplifier B3 exactly simulating the voltage shift introduced by the stage B2. The amplifier B3 is, preferably, identical to B2 and it then comprises a transistor T17 mounted as a follower and having its emitter supplied by a current source SC7. The input is the base of T17; the output is the emitter of T17 and is linked to the inverting input of the differential amplifier AD1, that is to say to the base of the transistor T9.

Although the embodiment described above is particularly advantageous, especially as far as the sample-and-hold device EB1 is concerned, other embodiments are possible and it is then necessary to adapt the composition of the circuit on the basis of the voltage shifts which it is desired to make good.

I claim:

1. Sampling circuit comprising:

a sample-and-hold device and a level locking circuit for referencing the sample-and-hold device with respect to a reference voltage level, the level locking circuit comprising a looped differential amplifier having a first input linked to the reference voltage, an output linked to an input of the sample-and-hold device, a switch for periodically opening and closing a link between the differential amplifier and the input of the sample-and-hold device, and a feedback loop linking the output of the amplifier to a second input of the amplifier, the sample-and-hold device introducing a voltage level shift between the input thereof and the output of the sampling circuit, wherein the feedback loop between the input of the sample-and-hold device and the second input of the differential amplifier comprises circuit elements introducing the same voltage shift as the shift present between the input of the sample-and-hold device and the output of the sampling circuit;

wherein the input of said sample-and-hold device is connected to the base of a first transistor mounted as a voltage follower, and said sample-and-hold device has an output linked to the emitter of said first transistor, a capacitor linked to the output of said sample-and-hold device for memorizing an output voltage between two sampling instants, and a sampling control input for blocking or allowing conduction of said first transistor, and in that the circuit elements introducing the voltage shift comprise a second transistor, the base-emitter junction of said second transistor being in series in the feedback loop.

2. Circuit according to claim 1, further comprising:

a circuit input linked to the input of the sample-and-hold device by a capacitor.

3. Circuit according to claim 1, wherein the sample-and-hold device comprises a third transistor in series between the emitter of the first transistor and a first source of emitter supply current, said sampling control input being connected to the base of the third transistor, the circuit elements introducing the voltage shift comprise a fourth transistor in series between the emitter of the second transistor and a second emitter supply current source identical to the first source of emitter supply current, the base of the fourth transistor being controlled such that the currents in the second and fourth transistors are identical, so that the base-emitter voltages of the first and second transistors are also identical.

4. A sampling circuit, comprising:

a sample-and-hold circuit which generates a voltage shift such that a voltage of a held signal has a voltage equal to a voltage of a sampled signal combined with said voltage shift; and an input signal reference locking loop, connected to said sample-and-hold circuit, including means for compensating for said voltage shift generated by said sample-and-hold circuit such that said input signal reference locking loop generates a voltage shift which is a same voltage shift as said voltage shift generated by said sample-and-hold circuit, and said input signal reference locking loop further including a differential amplifier having a first input connected to a reference voltage and a second input connected to said means for compensating for said voltage shift;

wherein said sample-and-hold circuit comprises:

a first bipolar junction transistor, arranged as a voltage follower, having the base thereof connected to an input of the sample-and-hold circuit; and a capacitor, connected to the emitter of the first bipolar junction transistor, for storing a voltage applied to said base less a voltage shift across the base-emitter junction of the first bipolar junction transistor which is at least in part said generated voltage shift;

wherein said means for compensating for said voltage shift, compensates for the voltage shift across the base-emitter junction of the first bipolar junction transistor using a second bipolar junction transistor having the base-emitter junction thereof connected in series in said input signal reference locking loop, wherein the voltage shift across the base-emitter junction of the first transistor is equal to the voltage shift across the base-emitter junction of the second transistor.

5. A sampling circuit according to claim 4, further comprising an input, connected to an input of the sample-and-hold circuit through a capacitor.

6. A sampling circuit according to claim 5, wherein a maximum number of transistors in said sample-and-hold circuit is three.

7. A sampling circuit according to claim 6, wherein each of said transistors is a bipolar junction transistor.

8. A sampling circuit according to claim 7, wherein each of said transistors is an NPN transistor.

9. A sampling circuit according to claim 4, wherein said sample-and-hold circuit further comprises:

a first emitter current source;

a third bipolar junction transistor, connected in series between the emitter of the first bipolar junction transistor and said first emitter current source, the base of the third bipolar junction transistor connected to a sampling command signal;

wherein the means for compensating for said voltage shift further comprises a fourth bipolar junction transistor, having the base thereof connected to the base of the third bipolar junction transistor, and the emitter thereof connected to a second emitter current source which has current generating characteristics which are equivalent to current generating characteristics of said first emitter current source such that a voltage shift across the base-emitter junctions of the first and second bipolar junction transistors are equivalent.

10. A sampling circuit according to claim 9, further comprising:

a buffer amplifier, connected to said capacitor of said sample-and-hold circuit, including a fifth bipolar junction transistor, connected as a voltage follower having the emitter thereof as an output of the sampling circuit and the base thereof connected to said capacitor of said sample-and-hold circuit;

wherein the base-emitter junction of the fifth bipolar junction transistor creates a voltage shift between said capacitor of said sample-and-hold circuit and the output of the sampling circuit; and wherein the means for compensating for said voltage shift further comprises a sixth transistor connected as a voltage follower having a base connected to the emitter of the second transistor and having an emitter connected to said second input of said differential amplifier.

11. A sampling circuit according to claim 4, further comprising:
- a buffer amplifier, connected to said capacitor of said sample-and-hold circuit, including a third bipolar junction transistor, connected as a voltage follower having the emitter thereof as an output of the sampling circuit and the base thereof connected to said capacitor of said sample-and-hold circuit;
- wherein the base-emitter junction of the third bipolar junction transistor creates a voltage shift between said capacitor of said sample-and-hold circuit and the output of the sampling circuit; and
- wherein said means for compensating for said voltage shift further comprises a fourth bipolar junction transistor having the base thereof connected to the emitter of the second bipolar junction transistor and the emitter thereof connected to the second input of the differential amplifier and said voltage shifts of the first and third bipolar junction transistors are compensated for by the voltage shifts of the second and fourth bipolar junction transistors.

12. A sampling circuit, comprising:
- a sample-and-hold circuit which generates a voltage shift such that a voltage of a held signal has a voltage equal to a voltage of a sampled signal combined with said voltage shift; and
- a level locking circuit, connected to the sample-and-hold circuit, for referencing the sample-and-hold circuit with a reference voltage level, said level locking circuit including:
  - a differential amplifier having a first input connected to the reference voltage level, an output, and a second input;
  - an output connected to an input of the sample-and-hold circuit;
  - a switch for opening and closing a connection between the output of the differential amplifier and the input of the sample-and-hold circuit; and
  - a circuit branch, connecting the output of the differential amplifier to the second input of the differential amplifier when said switch is closed, said circuit branch including the input of the sample-and-hold circuit and including means of generating, within said circuit branch, between said input of the sample-and-hold circuit and said second input of the differential amplifier, a voltage shift which compensates for said voltage shift generated by said sample-and-hold circuit.

13. A sampling circuit according to claim 12, further comprising an input, connected to an input of the sample-and-hold circuit through a capacitor.

14. A sampling circuit according to claim 13, wherein a maximum number of transistors in said sample-and-hold circuit is three.

15. A sampling circuit according to claim 14, wherein each of said transistors is a bipolar junction transistor.

16. A sampling circuit according to claim 15, wherein each of said transistors is an NPN transistor.

17. A sampling circuit according to claim 12, wherein said sample-and-hold circuit comprises:

- a first bipolar junction transistor, arranged as a voltage follower, having the base thereof connected to the input of the sample-and-hold circuit; and
- a capacitor, connected to the emitter of the first bipolar junction transistor, for storing a voltage applied to said base less a voltage shift across the base-emitter junction of the first bipolar junction transistor which is at least in part said generated voltage shift;
- wherein said means for compensating for said voltage shift, compensates for the voltage shift across the base-emitter junction of the first bipolar junction transistor using a second bipolar junction transistor having the base-emitter junction thereof connected in series in said circuit branch, wherein the voltage shift across the base-emitter junction of the first transistor is equal to the voltage shift across the base-emitter junction of the second transistor.

18. A sampling circuit according to claim 17, wherein said sample-and-hold circuit further comprises:
- a first emitter current source;
- a third bipolar junction transistor, connected in series between the emitter of the first bipolar junction transistor and said first emitter current source, the base of the third bipolar junction transistor connected to a sampling command signal;
- wherein the means for compensating for said voltage shift further comprises a fourth bipolar junction transistor, having the base thereof connected to the base of the third bipolar junction transistor, and the emitter thereof connected to a second emitter current source which has current generating characteristics which are equivalent to current generating characteristics of said first emitter current source, such that a voltage shift across the base-emitter junctions of the first and second bipolar junction transistors are equivalent.

19. A sampling circuit according to claim 18, further comprising:
- a buffer amplifier, connected to said capacitor of said sample-and-hold circuit, including a fifth bipolar junction transistor, connected as a voltage follower having the emitter thereof as an output of the sampling circuit and the base thereof connected to said capacitor of said sample-and-hold circuit;
- wherein the base-emitter junction of the fifth bipolar junction transistor creates a voltage shift between said capacitor of said sample-and-hold circuit and the output of the sampling circuit; and
- wherein the means for compensating for said voltage shift further comprises a sixth transistor connected as a voltage follower having a base connected to the emitter of the second transistor and having an emitter connected to said second input of said differential amplifier.

20. A sampling circuit according to claim 17, further comprising:
- a buffer amplifier, connected to said capacitor of said sample-and-hold circuit, including a third bipolar junction transistor, connected as a voltage follower having the emitter thereof as an output of the sampling circuit and the base thereof connected to said capacitor of said sample-and-hold circuit;
- wherein the base-emitter junction of the third bipolar junction transistor creates a voltage shift between said capacitor of said sample-and-hold circuit and the output of the sampling circuit; and wherein said means for compensating for said voltage shift further comprises a fourth bipolar junction transistor having the base thereof connected to the emitter of the second bipolar junction transistor and the emitter thereof connect to the second input of the differential amplifier and said voltage shifts of the first and third bipolar junction transistors are compensated for by the voltage shifts of the second and fourth bipolar junction transistors.

21. A sampling circuit having an input for receiving an analog voltage to be sampled and an output for supplying a sampled voltage representing the inputted analog voltage, said sampling circuit comprising:

a sample-and-hold device and a level locking circuit for referencing the sample-and-hold device with respect to a reference voltage level, the level locking circuit comprising a looped differential amplifier having a first input linked to the reference voltage, an output linked to an input of the sample-and-hold device, a switch for periodically opening and closing a link between the differential amplifier and the input of the sample-and-hold device, so that when said switch is open, the differential amplifier does not influence the input of said sample and hold device, and a feedback loop linking the input of the sample-and hold device to a second input of the amplifier, the sample-and-hold device introducing a non-zero voltage level shift between the input thereof and the output of the sampling circuit, wherein the feedback loop between the input of the sample-and-hold device and the second input of the differential amplifier comprises circuit elements introducing the same non-zero voltage shift across said circuit elements as the shift present between the input of the sample-and-hold device and the output of the sampling circuit whenever said feedback loop is linking the output of the amplifier to the second input of the amplifier.

22. A sampling circuit according to claim 21, further comprising:

a capacitor connected to the input of the sampling circuit.

23. A sampling circuit having an input for receiving an analog voltage to be sampled and an output for supplying a sampled voltage representing the inputted analog voltage, said sampling circuit, comprising:

a sample-and-hold circuit which generates a non-zero voltage shift such that a voltage of a held signal has a voltage equal to a voltage of a sampled signal combined with said voltage shift, said sample and hold circuit having an output connected to the output of said sampling circuit; and an input signal reference locking loop, connected to said sample-and-hold circuit, including means for compensating for said voltage shift generated by said sample-and-hold circuit such that there is a non-zero voltage shift across said input signal reference locking loop which is a same non-zero voltage shift as said voltage shift generated by said sample-and-hold circuit, and said input signal reference locking loop further including a differential amplifier having a first input connected to a reference voltage and a second input connected to said means for compensating for said voltage shift;

wherein said input signal locking loop generates said non-zero voltage shift which is the same non-zero voltage shift as said voltage shift generated by said sample-and-hold circuit when said input signal locking loop is connected between said second input of the differential amplifier and said sample-and-hold circuit.

24. A sampling circuit according to claim 23, further comprising:

a capacitor connected to the input of the sampling circuit.

* * * * *

UNITED STATES PATENT AND TRADEMARK OFFICE
CERTIFICATE OF CORRECTION

PATENT NO.　：　5,506,525
DATED　　　：　April 9, 1996
INVENTOR(S)：　Jean-francois DEBROUX It is certified that error appears in the above-indentified patent and that said Letters Patent is hereby corrected as shown below:

On the title page, Item [87], the PCT publishing date is incorrect in the Letters Patent. It should read:

--[87] PCT Pub. No.: WO91/11812

PCT Pub. Date: Aug. 8, 1991--

Signed and Sealed this

Sixteenth Day of July, 1996

Attest:

BRUCE LEHMAN

*Attesting Officer*　　　*Commissioner of Patents and Trademarks*